(12) United States Patent
Li

(10) Patent No.: US 10,961,123 B2
(45) Date of Patent: Mar. 30, 2021

(54) APPARATUS AND METHOD FOR SYNTHESIZING VERTICALLY ALIGNED CARBON NANOTUBES

(71) Applicant: Wenzhi Li, Palmetto Bay, FL (US)

(72) Inventor: Wenzhi Li, Palmetto Bay, FL (US)

(73) Assignee: The Florida International University Board of Trustees, Miami, FL (US)

( * ) Notice: Subject to any disclaimer, the term of this patent is extended or adjusted under 35 U.S.C. 154(b) by 57 days.

(21) Appl. No.: 16/435,989

(22) Filed: Jun. 10, 2019

(65) Prior Publication Data

US 2020/0002171 A1   Jan. 2, 2020

Related U.S. Application Data

(62) Division of application No. 16/023,038, filed on Jun. 29, 2018, now Pat. No. 10,336,618.

(51) Int. Cl.
*C23C 16/26* (2006.01)
*C23C 16/50* (2006.01)
(Continued)

(52) U.S. Cl.
CPC ........ *C01B 32/162* (2017.08); *C23C 16/0236* (2013.01); *C23C 16/26* (2013.01);
(Continued)

(58) Field of Classification Search
CPC ... C23C 16/0236; C23C 16/26; C23C 16/503; C23C 16/50; C01B 32/162; B82Y 40/00
(Continued)

(56) References Cited

U.S. PATENT DOCUMENTS

| | | | |
|---|---|---|---|
| 2006/0177602 A1* | 8/2006 | Dijon | .................. C03C 17/3626 427/577 |
| 2013/0203139 A1 | 8/2013 | Yukawa et al. | |
| 2015/0240351 A1* | 8/2015 | Chen | ..................... C23C 16/503 428/408 |

FOREIGN PATENT DOCUMENTS

| | | | |
|---|---|---|---|
| EP | 0 665 187 | * | 8/1995 |
| JP | 2005-001938 | * | 1/2005 |

OTHER PUBLICATIONS

Ren et al., "Synthesis of Large Arrays of Well-Aligned Carbon Nanotubes on Glass", Science, 1998, pp. 1105-1107, vol. 282, No. 5391.

(Continued)

*Primary Examiner* — Elizabeth A Burkhart
(74) *Attorney, Agent, or Firm* — Saliwanchik, Lloyd & Eisenschenk

(57) ABSTRACT

Methods and devices to synthesize vertically aligned carbon nanotube (VACNT) arrays directly on a catalytic conductive substrate without addition of an external metallic catalyst layer and without any pretreatment to the substrate surface using a plasma enhanced chemical vapor deposition (PECVD) method are provided. A method comprises providing a catalytic conductive substrate, that has not been pretreated through a plasma enhanced chemical vapor deposition (PECVD) method or other methods, to a PECVD device, etching the catalytic conductive substrate to form catalytically active nano-features on the surface of the catalytic conductive substrate, and growing vertically aligned carbon nanotubes on the surface of the catalytic conductive substrate, without an external metallic catalyst layer, by providing a carbon source gas to the catalytic conductive substrate.

20 Claims, 8 Drawing Sheets

(51) Int. Cl.
*C01B 32/162* (2017.01)
*C23C 16/02* (2006.01)
*B82Y 30/00* (2011.01)
*B82Y 40/00* (2011.01)

(52) U.S. Cl.
CPC .............. *C23C 16/50* (2013.01); *B82Y 30/00* (2013.01); *B82Y 40/00* (2013.01); *C01B 2202/08* (2013.01)

(58) Field of Classification Search
USPC .......................................................... 118/715
See application file for complete search history.

(56) References Cited

OTHER PUBLICATIONS

Lin et al., "Field emission properties of aligned carbon nanotubes grown on stainless steel using CH4/CO2 reactant gas", Diamond and Related Materials, 2004, pp. 1026-1031, vol. 13, Issues 4-8.

Neupane et al., "Synthesis and electron field emission of vertically aligned carbon nanotubes grown on stainless steel substrate", 26th International Vacuum Nanoelectronics Conference (IVNC), 2013, pp. 1-2.

Song et al., "Field emission from carbon nanotube arrays fabricated by pyrolysis of iron phthalocyanine", Journal of Physics D: Applied Physics, 2003, pp. 5-9, vol. 37.

Melechko et al., "Vertically aligned carbon nanofibers and related structures: Controlled synthesis and directed assembly", Journal of Applied Physics, 2005, pp. 04130 (pp. 1-39), vol. 97, No. 4.

Neupane et al., "Synthesis and field emission properties of vertically aligned carbon nanotube arrays on copper", Carbon, 2012, pp. 2641-2650, vol. 50, No. 7.

Prasek et al., "Methods for carbon nanotubes synthesis—review", Journal of Materials Chemistry, 2011, pp. 15872-15884, vol. 21, No. 40.

Hofmann et al., "Low-temperature growth of carbon nanotubes by plasma-enhanced chemical vapor deposition", Applied Physics Letters, 2003, pp. 135-137, vol. 83, No. 1.

Ren et al., "Growth of a single freestanding multiwall carbon nanotube on each nanonickel dot", Applied Physics Letters,1999, pp. 1086-1088, vol. 75, No. 8.

Katsounaros et al., "Microwave characterization of vertically aligned multiwalled carbon nanotube arrays", Applied Physics Letters, 2011, pp. 203105 (pp. 1-3), vol. 98, No. 20.

Wang et al., "Nucleation and growth of well-aligned, uniform-sized carbon nanotubes by microwave plasma chemical vapor deposition", Applied Physics Letters, 2001, pp. 4028-4030, vol. 78, No. 25.

Sano, et al., "A simple oxidation-reduction process for the activation of a stainless steel surface to synthesize multi-walled carbon nanotubes and its application to phenol degradation in water", Carbon, 2012, pp. 115-122, vol. 50, No. 1.

Hashempour et al., "Effects of CVD direct growth of carbon nanotubes and nanofibers on microstructure and electrochemical corrosion behavior of 316 stainless steel", Materials Characterization, 2014, pp. 64-76, vol. 92.

Sano et al., "Fabrication of carbon nanotube film directly grown on conductive stainless steel film and application to dielectrophoretic nanoparticle capture", Journal of Applied Physics, 2014, pp. 154302 (pp. 1-6), vol. 115, No. 15.

Pattison, et al., "Mechanism and Enhanced Yield of Carbon Nanotube Growth on Stainless Steel by Oxygen-Induced Surface Reconstruction", Chemistry of Materials, 2015, pp. 932-937, vol. 27, No. 3.

Hashempour et al., "Direct growth of MWCNTs on 316 stainless steel by chemical vapor deposition: Effect of surface nano-features on CNT growth and structure", Carbon, 2013, pp. 330-347, vol. 63.

Baddour et al., "A simple thermal CVD method for carbon nanotube synthesis on stainless steel 304 without the addition of an external catalyst", Carbon, 2008, pp. 313-318, vol. 47, No. 1.

Park et al., "Pretreatment of stainless steel substrate surface for the growth of carbon nanotubes by PECVD", Journal of Materials Science, 2003, pp. 4933-4939, vol. 38.

Park et al., Synthesis of carbon nanotubes on metallic substrates by a sequential combination of PECVD and thermal CVD, Carbon, 2003, pp. 1025-1029, vol. 41, No. 5.

Abad et al., "Catalytic growth of carbon nanotubes on stainless steel: Characterization and frictional properties", Diamond and Related Materials, 2008, pp. 1853-1857, vol. 17, No. 11.

Masarapu et al., "Direct Growth of Aligned Multiwalled Carbon Nanotubes on Treated Stainless Steel Substrates", Langmuir, 2007, pp. 9046-9049, vol. 23, No. 17.

Chhowalla et al., "Growth process conditions of vertically aligned carbon nanotubes using plasma enhanced chemical vapor deposition", Journal of Applied Physics, 2001, pp. 5308-5317, vol. 90, No. 10.

Bower et al., "Nucleation and growth of carbon nanotubes by microwave plasma chemical vapor deposition", Applied Physics Letters, 2000, pp. 2767-2769, vol. 77, No. 17.

Neupane, "Synthesis and enhanced electron field emission of vertically aligned carbon nanotubes grown on stainles steel substrate", Journal of Nanoscience Letters, 2014, pp. 1-7.

Sinha et al., "Field Emission Properties of Carbon Nanotube Thin Films Grown on Different Substrate Materials", 8th IEEE Conference on Nanotechnology, 2008, pp. 270-273.

* cited by examiner

Fig. 2a   Fig. 2b   Fig. 2c   Fig. 2d
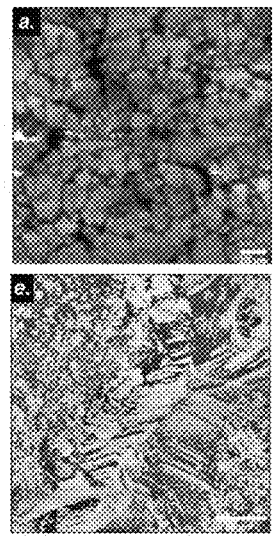 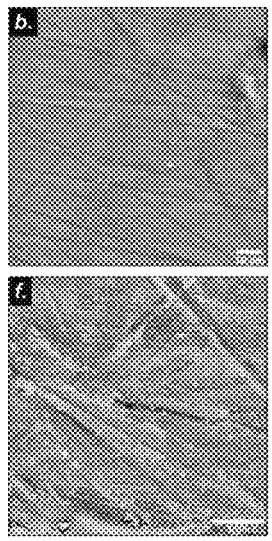 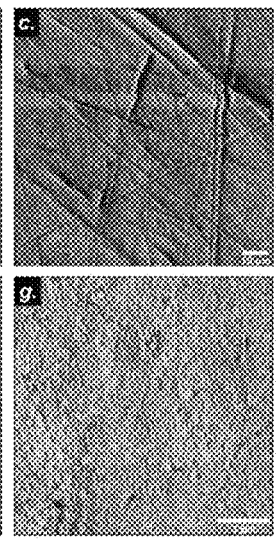 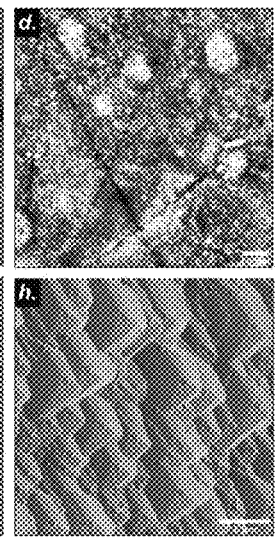
 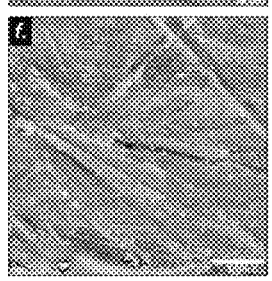 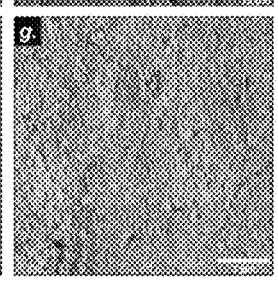 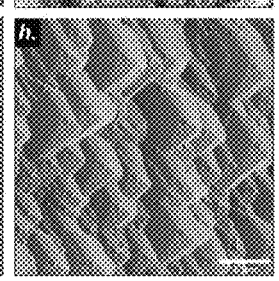
Fig. 2e   Fig. 2f   Fig. 2g   Fig. 2h Fig. 3a
Fig. 3b
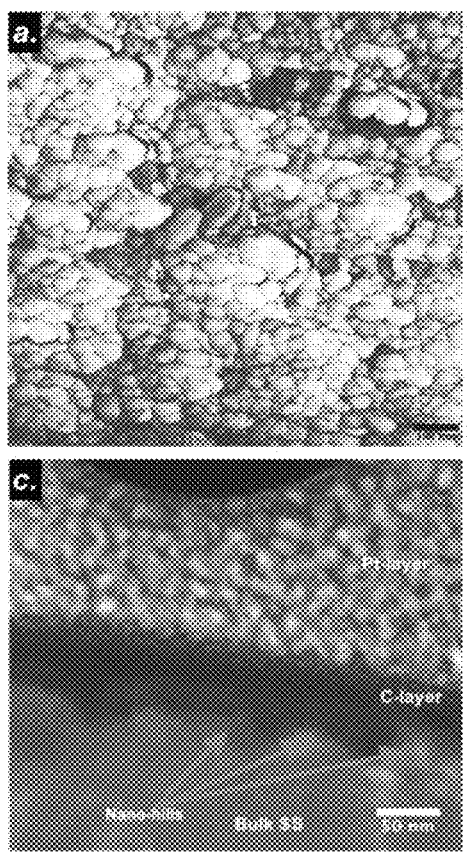
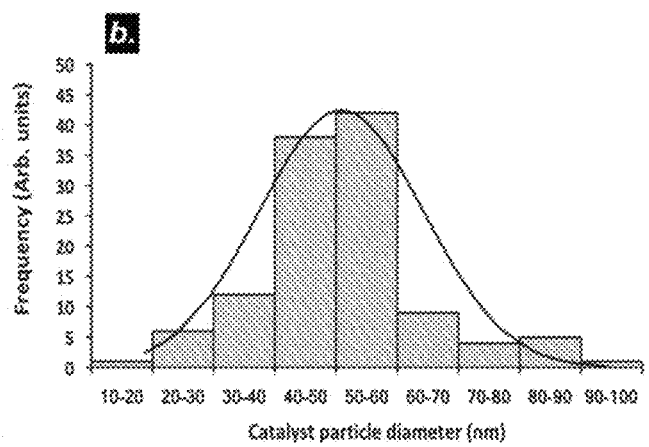
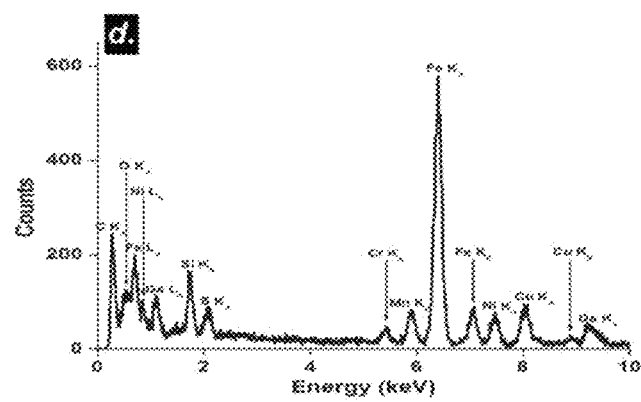
Fig. 3c
Fig. 3d

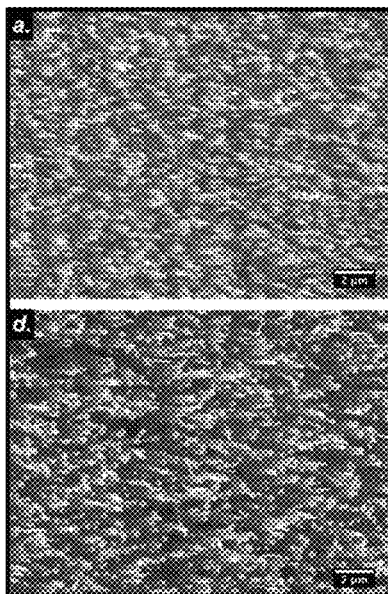
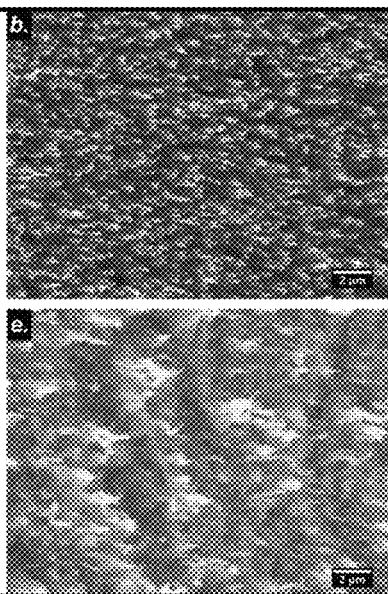
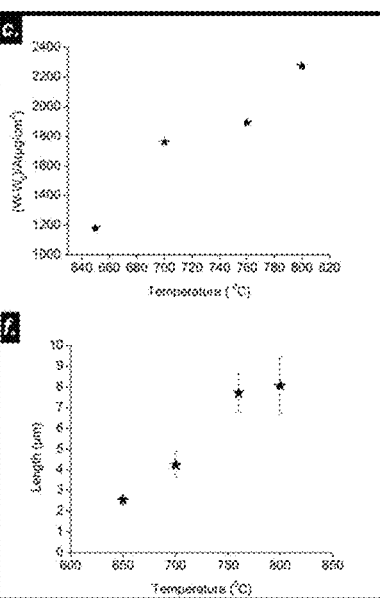
Fig. 4a          Fig. 4b          Fig. 4c
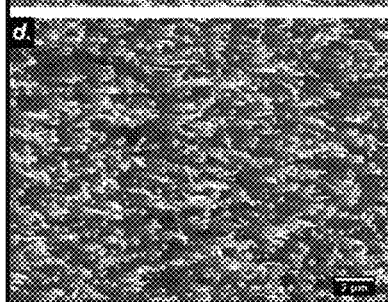
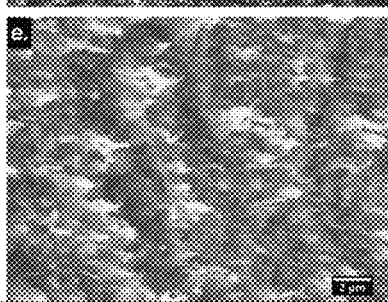
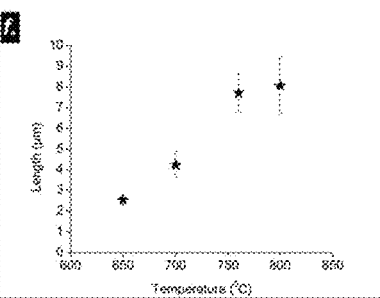
Fig. 4d          Fig. 4e          Fig. 4f

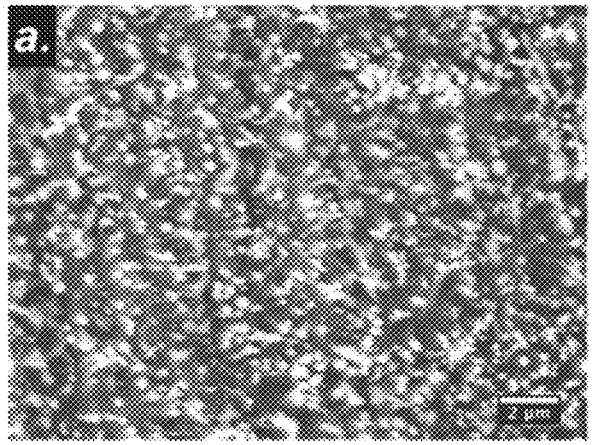
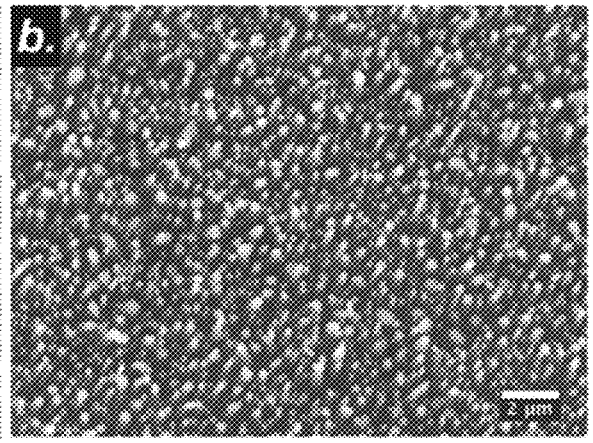
Fig. 6a	Fig. 6b
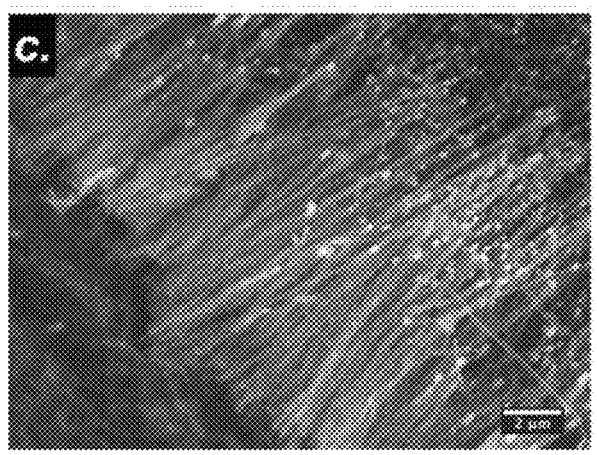
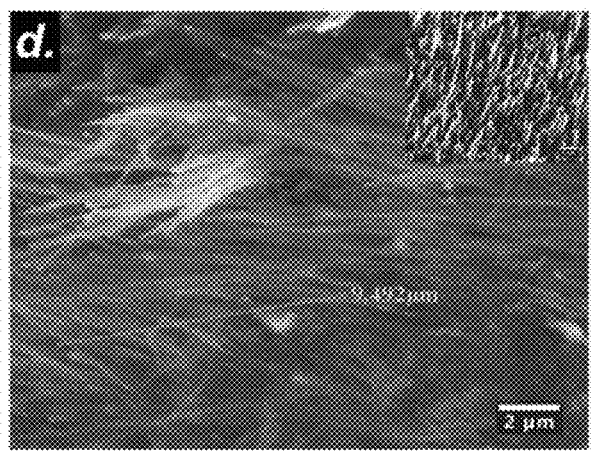
Fig. 6c	Fig. 6d

APPARATUS AND METHOD FOR SYNTHESIZING VERTICALLY ALIGNED CARBON NANOTUBES

CROSS REFERENCE TO RELATED APPLICATION

The present application is a divisional application of U.S. application Ser. No. 16/023,038, filed Jun. 29, 2018, the disclosure of which is hereby incorporated by reference in its entirety, including all figures, tables, and drawings.

STATEMENT OF GOVERNMENT SUPPORT

This invention was made with government support under Grant Nos. DMR0548061 and DMR1506640 awarded by the National Science Foundation. The government has certain rights in the invention.

BACKGROUND

Since the discovery of carbon nanotubes (CNTs), time, money, and efforts have been expended to exploit their properties towards developing new devices and improving current technologies. Due to their unique physical structures, including one dimensionality, high surface area, high aspect ratio, and exceptional electronic, mechanical and thermal properties, CNTs have shown potential for a number of different applications Plasma enhanced chemical vapor deposition (PECVD) has been used to synthesize vertically aligned CNT (VACNT) arrays at lower temperatures. However, many PECVD techniques are complex and expensive and limited to research laboratory scale which make them unsuitable for the large-scale production. There is also the possibility of having a weak attachment of catalyst nanoparticles to the substrate, which helps cause degradation of VACNT composites over time. Hence, for the applications like field emission, electrodes and sensors, it is desirable to grow VACNTs directly on a conducting catalytic substrate without addition of an external catalyst layer.

BRIEF SUMMARY

Embodiments of the subject invention provide methods and apparatuses for the synthesis of vertically aligned carbon nanotube (VACNT) arrays directly on a catalytic conductive substrate without the addition of an external metallic catalyst layer and without any pretreatment to the substrate surface by using a plasma enhanced chemical vapor deposition (PECVD) method or other method. The VACNTs have uniform length, good alignment, and uniform coverage over the catalytic conductive substrate surface. A study of surface morphology of the catalytic conductive substrate prior to the growth of the VACNTs, as revealed by atomic force microscopy (AFM) and scanning electron microscope (SEM) images, underlines the occurrence of important surface evolution due to ramping the temperature in the presence of an etching gas to form uniform nano-hills, which play a role in VACNT nucleation and the growth process.

Transmission electron microscope (TEM) analysis and energy-dispersive X-ray spectroscopy (EDS) report show that the particles at the tip of the VACNTs are Fe crystal. Although other transition metals (Ni, Co, Mn) were also present at the catalyst nano-hills, only Fe allows the dissolution and precipitation of carbon and lifts off during the growth process. In addition, no trace of oxygen or carbide was found in the catalyst tip particle indicating the purity of single crystal Fe. Hence, as-synthesized VACNTs with pure Fe at the tip are useful in the fields of drug delivery and field emission devices.

BRIEF DESCRIPTION OF DRAWINGS

FIGS. 2a-2d show low (100×100 μm scan) resolution AFM images of the following samples: an as-received stainless steel (SS) sample, a polished SS sample, a SS sample with temperature ramping (760° C.) in an $NH_3$ (400 sccm) environment, and a SS sample with temperature ramping (760° C.) in an Ar (400 sccm) environment, respectively. FIGS. 2e-2h show high (5×5 μm scan) resolution AFM images of the following SS samples: an as-received SS sample, a polished SS sample, a SS sample with temperature ramping (760° C.) in an $NH_3$ (400 sccm) environment, and a SS sample with temperature ramping (760° C.) in an Ar (400 sccm) environment, respectively.

FIG. 3a shows a 1×1 μm scan resolution AFM image of a polished and ramp heated sample in an $NH_3$ environment. FIG. 3b is a plot of catalyst particles sizes (lateral) in nm. FIG. 3c is an SEM image of a cross-section of a sample heated in a $NH_3$ environment. FIG. 3d is a plot of an energy dispersive x-ray spectrum (EDS) obtained from a nano-hill shown in FIG. 3c.

FIGS. 4a, 4b, 4d, and 4e shows SEM image of VACNTs synthesized on SS substrate at 650° C., 700° C., 760° C., and 800° C., respectively. FIG. 4c is a plot of the variation of yield over different growth temperatures. FIG. 4f shows a plot of variation of VACNT length over different growth temperatures.

FIGS. 6a-6e show SEM images of as-synthesized VACNTs on a SS substrate at growth times of 3 min, 5 min, 10 min, 15 min, and 20 min, respectively.

DETAILED DESCRIPTION

Figure 1:
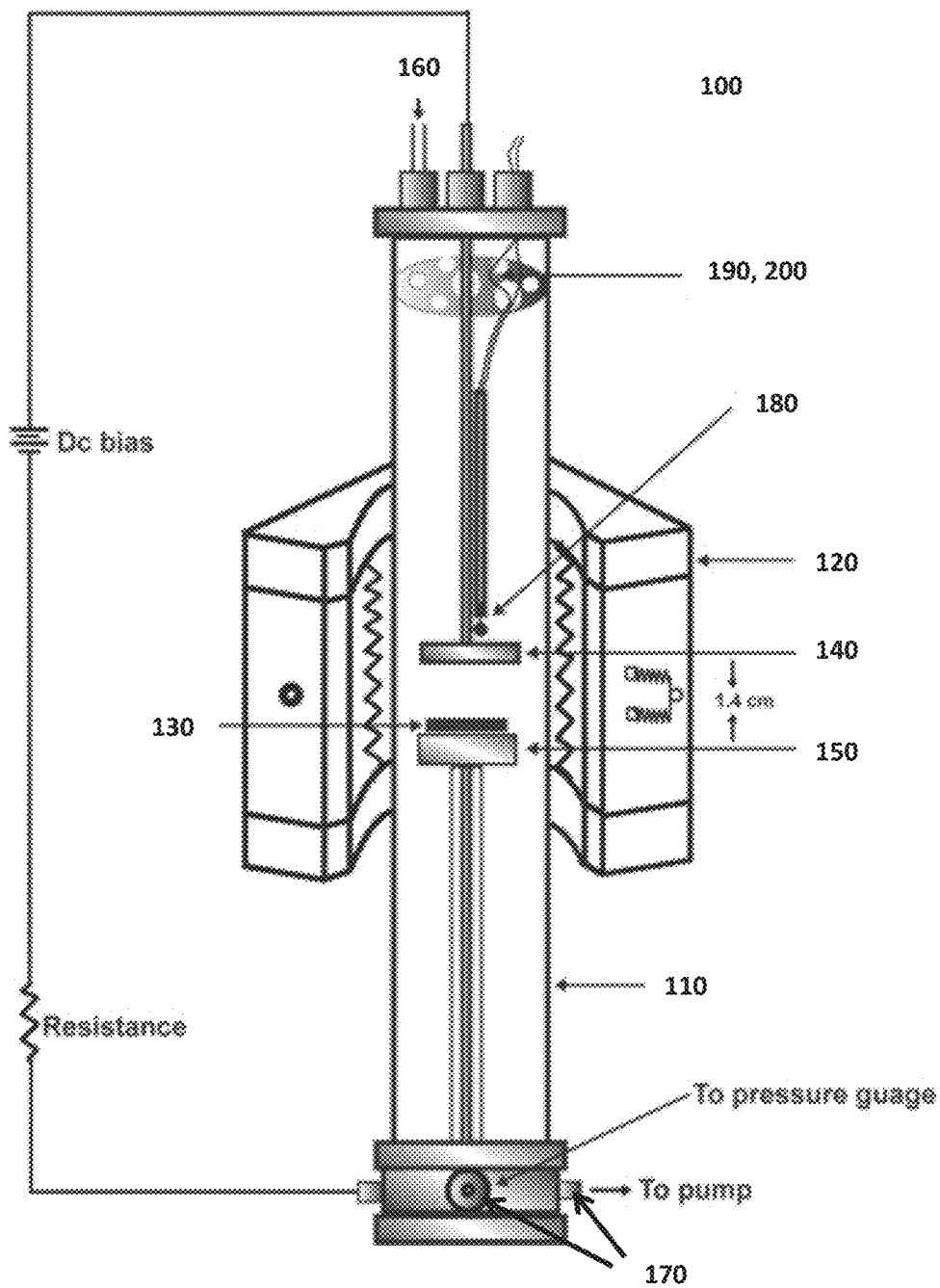
FIG. 1 is a schematic diagram of a plasma enhanced chemical vapor deposition system used to synthesize vertically aligned carbon nanotubes (VACNTs).

The following disclosure and exemplary embodiments are presented to enable one of ordinary skill in the art to synthesize vertically aligned carbon nanotube (VACNT) arrays directly on a catalytic conductive substrate without addition of an external metallic catalyst layer and without any pretreatment to the substrate surface using a plasma enhanced chemical vapor deposition (PECVD) method, according to embodiments of the subject invention. Various modifications to the embodiments will be readily apparent to those skilled in the art and the generic principles herein may be applied to other embodiments. Thus, the devices and methods related to the VACNT arrays are not intended to be limited to the embodiments shown, but are to be accorded the widest scope consistent with the principles and features described herein.

A catalytic conductive substrate, for example a stainless steel substrate, can be loaded on a sample holder inside of a tube of a PECVD device and the pressure inside the tube can be adjusted to a base pressure. This catalytic conductive substrate is not subjected to pretreatment in a PECVD device. In addition to stainless steel, the substrate can comprise various alloys including, but not limited to, as Inconel®, ferronickel, and alnico; and metals including, but not limited to, iron, nickel, or cobalt. A mixture of carbon source gas at different flow rates and a plasma etching gas at a constant flow rate can be introduced to synthesize the VACNTs. In one embodiment, the carbon source gas is either acetylene ($C_2H_2$) methane ($CH_4$), ethylene ($C_2H_4$), or ethanol ($C_2H_5OH$). In one embodiment, the etching gas can be ammonia gas ($NH_3$). In addition to any gases described herein, the precursor (carbon source) gases can comprise ammonia ($NH_3$) gas and hydrogen ($H_2$) gas can be used as reduction gas for assisting the growth of VACNTs. In certain embodiments, the base pressure is set to 0.01 Torr, the carbon source gas is introduced to the catalytic conductive substrate at a rate of 10, 15, 25, or 35 sccm, and the etching gas is introduced at a rate of 400 sccm. The catalytic conductive substrate can be ramp heated to different growth temperatures at a constant rate under the etching gas environment and at a constant pressure.

In one embodiment, the catalytic conductive substrate can be ramp heated to different growth temperatures in a range of 650 to 800° C. at a constant rate of 50° C./min (for example, 650° C., 700° C., 760° C., and 800° C.) under the etching gas environment at a constant pressure, for example 7 Torr.

Once a growth temperature is reached, DC plasma can be initiated and maintained at different respective plasma power levels in a range of 9 to 92 W, for example, 65, 70, 80, and 92 W. Carbon source gas can be introduced after the plasma becomes stable. The VACNTs can be grown for different time durations between 2 and 20 minutes, for example, 2, 3, 5, 10, 15, or 20 minutes, and then allowed to cool down under a base pressure.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

VACNT arrays growth experiments were performed on stainless steel 304 type (SS-SH-C-6000, thickness 0.63 mm, Kimball Physics, Inc.). An as-received SS sheet was cut into small pieces having dimensions of 1 cm×1 cm×0.63 mm and then polished with sand paper of different grit sizes (Norton 120, 1200, 2400 and 4000 grits, respectively) to a smooth finish. Then, the pieces were cleaned ultrasonically with acetone and isopropyl alcohol (IPA) baths, each for 10 minutes in order to remove organic/inorganic contaminants.

Experiments were conducted using a PECVD system 100, as seen in FIG. 1. The PECVD system comprises a tube 110, for example a quartz tube having a diameter 10 cm and a length of 43 cm, and an external heater 120 configured to surround a substrate 130 on a substrate holder. In one embodiment, the heater 120 is an infrared image furnace. Two metallic rods, for example a cylindrical copper rod (diameter=25.5 mm), respectively having an anode 140 and a cathode 150. A voltage source used to apply a bias voltage to create plasma. In one embodiment, the anode 140 and the cathode 150 are at a distance of 1.4 cm from each other. A DC power supply (not shown) can be connected to the anode 140 and the cathode 150. The plasma power between the anode 140 and the cathode 150 can be adjusted to a desired plasma power for a specific application. A gas inlet 160 and outlet 170 are present at the two closed ends of the tube 110 so that carbon source and etching (or reducing) gases could be fed into and pumped out of the tube 110. A regulator or multiple regulators (not shown) can be configured to control the flow of gas into and out of the tube 110. A thermocouple 180 was used to monitor the temperature and provide feedback to the heater's power supply. A heat reflector 190 and gas distributor 200 were disposed in the tube 110.

Example 1

In order to study the surface morphology prior to the introduction of the carbon source gas, two different substrates were prepared by ramp heating the substrates to 760° C. (normal ramping heat) under an $NH_3$ environment and an argon (Ar) environment, respectively, both at 400 sccm and a pressure of 7 Torr. The study of the surface nano-features and composition of the as-prepared samples prior to $C_2H_2$ introduction was performed by (a) an atomic force microscopy (AFM) system in tapping mode (Veeco Multimode Nanoscope III D) with a Si tip (spring constant=42 N/m and resonance frequency=250-300 KHz) and (b) a dual-beam focused ion beam (FIB) system equipped with an Energy Dispersive X-ray Spectrometer (EDS) and a Scanning Electron Microscope (SEM).

Microstructural characterization of the as-synthesized VACNTs samples was carried out by using a field emission SEM (JEOL JSM-6330F) operated at an accelerating voltage of 25 KV. FEI Tecnai F30 TEM operated at 300 KV equipped with Energy Dispersive Analysis of X-rays (EDAX) technology and FEI Titan 02 80-200 equipped with Chemi-STEM Technology operated at 200 KV were used to study the nanostructures of the as-synthesized VACNTs. For the TEM experiment, as-synthesized VACNTs were scratched off of the SS substrate with a tweezer, dispersed ultrasonically in alcohol for 5 min, and transferred to the TEM grid.

The study of surface morphology of the SS substrates prior to the introduction of carbon source gases provided information regarding the growth mechanism of VACNTs on the catalytic substrates. On-site decomposition of the carbon source ($C_2H_2$) and diffusion of the carbon atoms or clusters into the active nucleation sites (nano-sized catalyst islands) are part of the VACNT's growth mechanism. Hence, abundant and uniform availability of active nucleation sites on the substrate surface promote the synthesis of the VACNTs.

FIGS. 2a and 2e show AFM images of the surfaces of the as-received and polished SS samples, respectively. Large grains with clear features and having a lateral size in a range of a few microns to approximately 17 microns were observed on the as-received sample surface. These large grains on the surface were possibly a thin layer of chromium passive oxide ($Cr_2O_3$). Although, having the layer on the surface of the SS substrate is advantageous against corrosion, the layer's poisonous effect on a metal (Fe) catalyst has adverse effect on VACNT growth. Granular microstructures or microscale features can inhibit the VACNTs growth, but can be removed through polishing. After polishing, no nano-features, which act as catalytic sites for VACNT growth, on the surface of the samples were detected (see, for example, FIGS. 2b and 2f).

FIGS. 2c and 2d show AFM images of the sample surfaces ramp heated to a temperature of 760° C. at a rate of 50° C./min under an $NH_3$ and an Ar (both at 400 sccm) environment, respectively (FIGS. 2g and 2h are respective corresponding high-resolution AFM images). These AFM images suggest that the heat treatment in the presence of these two gases affects the surface evolution of the sample substrate in regards to forming the nano-sized catalyst particles. Particularly, the presence of $NH_3$ creates a uniform breakup of the surface of the substrates by etching the surface and forming more uniform nano-hills of average lateral diameter 50.91 nm (see, for example, FIGS. 3a and 3b). Features with a dimension of more than 1 micron were observed in the presence of the Ar gas (see, for example, FIG. 2h).

Example 2

To investigate the surface morphology and perform compositional analysis of the nano-features on a substrate heated in the presence of $NH_3$, a cross-section of the sample was extracted by using Ga-ion FIB and investigated on a FEI Tecnai F30 TEM device operated at 300 KV equipped with Energy Dispersive Analysis of X-rays (EDAX) technology using STEM imaging.

FIG. 3c shows the cross-sectional structure of the sample in which a platinum (Pt) layer was deposited to protect the surface features from a current beam during the milling process. In addition, a thin layer of carbon was deposited prior to the SEM study during the milling process. Beneath this carbon layer, a native surface of the sample was characterized by the presence of nano-hills, which were also seen on a high-resolution AFM image, (see, for example, FIG. 3a). FIG. 3d shows a plot of the energy dispersive x-ray spectrum (EDS) obtained from one of the nano-hills shown in FIG. 3c.

The EDS result shows that the constituents of the nano-features comprise Fe, Ni, and Cr; which are also the native components of the as-received SS. The characteristics of the sample surface, prior to the flow of carbon source, contribute to the breakup of the surface of the substrate and are related to the formation of the catalytic active sites used for VACNT nucleation. This surface evolution after polishing and before the supply of carbon source, as revealed by AFM and STEM images (see, for example, FIGS. 3a and 3c), can be attributed to environmental factors such as high temperature, etching gas atmosphere, presence of oxides or carbide, and complex processes related to surface energy. The reduction of metal oxides and carbides to their metal phases is important as they are not catalytically active for the VACNT synthesis.

The combined effect of these processes results in a chemical and structural rearrangement at the surface of the SS substrate on an atomic and a nanoscale level. The chemical and structural rearrangement causes the surface to breakup, which exposes the catalytic active sites. In addition, the breakup of the surface results in more surface area and more crystallographic defects, which generates more catalytically active sites for dissociative adsorption and precipitation of elemental carbon made available from the dissociation of the carbon source gas at an elevated temperature.

The VACNT growth mechanism on a catalytic substrate can be understood as follows: preheating the polished SS substrate under a flow of $NH_3$ gas creates the catalytic active nano-hills on the substrate surface. The carbon, released upon the decomposition of the carbon source gas and coupled with heat from the plasma sheath and heater, dissolves and diffuses into the catalyst nano-particles. Finally, VACNTs are formed as a result of carbon precipitation from the catalyst surface once supersaturation is reached. Each VACNT can contain catalyst particles at a tip depending on the growth mechanism inherited (for example, base growth or tip growth).

As VACNTs have highly anisotropic polarizability in the presence of external electric field, the electric field present in the plasma sheath helps to align the VACNTs (perpendicular to the substrate surface and hereinafter referred to as the vertical direction). Additionally, plasma can be used to etch the amorphous carbon deposited during the growth process. Flow of $NH_3$ or $H_2$ (H-rich gas) removes any amorphous carbon that was not already removed through hydrocarbon precursor dissociation. This etching process can keep the catalyst particles free of amorphous carbon so that the catalyst gets continuous access to the carbon source gas.

FIGS. 4a, 4b, 4d, and 4e show a 15° tilt view of SEM images of VACNTs synthesized at 650° C., 700° C., 760° C., and 800° C. temperature, respectively. These images show the distribution and alignment of the individual self-standing VACNTs. These samples were prepared by keeping the other parameters, such as the flow rate of $NH_3$ (400 sccm), the flow rate of $C_2H_2$ (15 sccm), the plasma power (70 W), the growth time (10 min), and the pressure inside the tube (7 Torr) constant during the synthesis period.

The substrate was covered by aligned and uniform VACNTs by using PECVD method. FIGS. 4a, 4b, 4d, and 4e illustrate the effect of temperature on the growth of VACNTs on the SS substrate. At a temperature of 650° C., the sample substrate was non-uniformly covered with VACNTs of short and non-uniform length, as seen in FIG. 4a. The average diameter of the VACNTs was 101 nm and the length was 2.5 µm. The average length of the VACNTs increased to 4.2 µm and 7.8 µm at temperatures of 700° C. and 760° C., respectively. The average diameter was found to increase to 114.5 nm and 115 nm at temperatures of 700° C. and 760° C., respectively. In addition, the sample substrates were covered with VACNTs having a uniform length. The density of the VACNTs was approximately $9 \times 10^8$ per $cm^2$ for the VACNTs formed at temperatures of 700° C. and 760° C. The average length and diameter of the VACNTs were 8.1 µm and 105.6 nm respectively for the VACNTs grown at 800° C.

After growing the VACNTs at 800° C. for 10 minutes, the substrate surface was covered with amorphous carbon and some poorly aligned VACNTs as shown in FIG. 4e. This growth pattern suggests that the growth of VACNT on a SS substrate happens in a certain temperature range. A temperature of 650° C. was insufficient to produce the thermal energy necessary for the reconstruction of the substrate surface before the flow of hydrocarbon gas and hence formation of catalytic active nano-hills. The 650° C. temperature is also insufficient for the decomposition of the hydrocarbon gas ($C_2H_2$) to liberate the carbon. A lack of carbon and active nucleation sites, where catalytic diffusion and precipitation takes place, leads to a non-uniform growth of VACNTs which have short and non-uniform lengths.

As the temperature increases above 760° C., the rate of decomposition of carbon source gas increased dramatically. The difference between the growth rate of VACNTs and decomposition rate of carbon source gas lead to an availability of an excess of carbon which no longer graphitized to form VACNT walls and became attached to the exterior of the VACNTs in an amorphous form, as shown in FIG. 4e. This could have also been caused by ion bombardment as a result of higher ionization of plasma at a higher temperature.

FIG. 4c shows a plot of the VACNT yields as a function of temperature. As seen in the figure, the yield increases linearly as the temperature is increased. Amorphous carbon was formed along with the VACNTs grown at 800° C. This result is consistent with the results presented by the plot in FIG. 4f, which shows the increase in length with temperature.

Moreover, the average length of VACNTs increased by 0.3 μm while increasing the temperature from 760° C. to 800° C. The VACNTs synthesized directly on the catalytic SS substrate at 700° C. had a length 4.2 μm, a diameter of approximately 115 nm, and exhibited superior field emission properties.

Figure 6E:
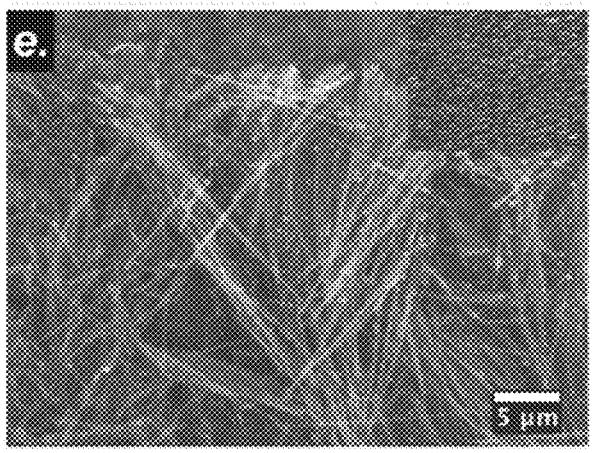
Figure 6F:
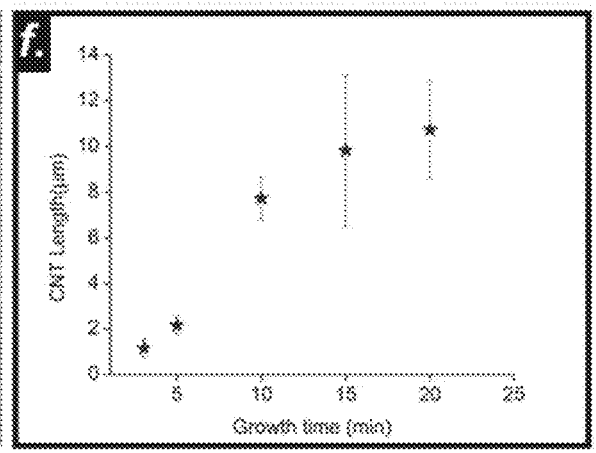
FIG. 6f shows a plot of the variation of VACNT length (μm) with time (min).

The effect of growth time on the morphology of VACNTs is shown in FIG. 6. From FIG. 6, it can be seen that the VACNTs grew approximately 1.2 μm in 3 min. The average length increased to 2.2 μm, 7.8 μm, 9.8 μm and 10.7 μm when the growth time was increased to 5 min, 10 min, 15 min and, 20 min, respectively, and all other conditions were kept constant. The length of the VACNTs was found to increase rapidly for the initial 15 minutes. However, after 15 minutes, the rate of growth slowed down. This is because after certain time, the catalyst particles lose their catalytic activity and do not allow further dissolution and precipitation of carbon to form VACNTs during the growth process.

Example 3

Paschen's law governs the minimum potential that should be applied between the parallel plate electrodes for a given electrode distance, gas composition, and pressure. Once a sufficient voltage is applied, the breakdown of the gas composition occurs forming a strong electric field, high ion flux, and plasma near the cathode surface. This plasma enhances the VACNTs growth rate and aligns them along the direction of the electric field. The effect of plasma power on the morphology of the VACNTs is shown in FIG. 7.

Figure 7A:
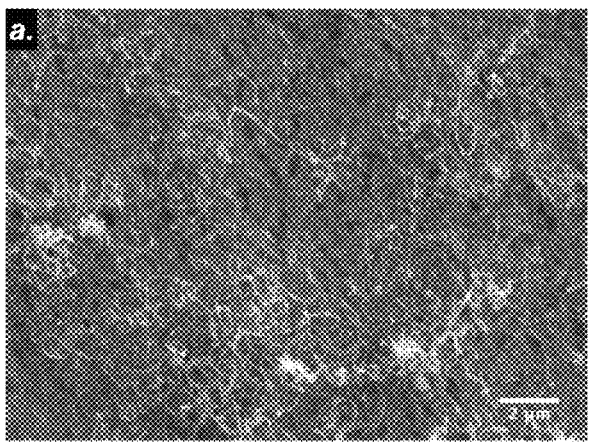
FIG. 7a-7d show SEM images of as-synthesized VACNTs grown on SS substrate at plasma power of 9 W, 40 W, 70 W and 92 W, respectively.
Figure 7B:
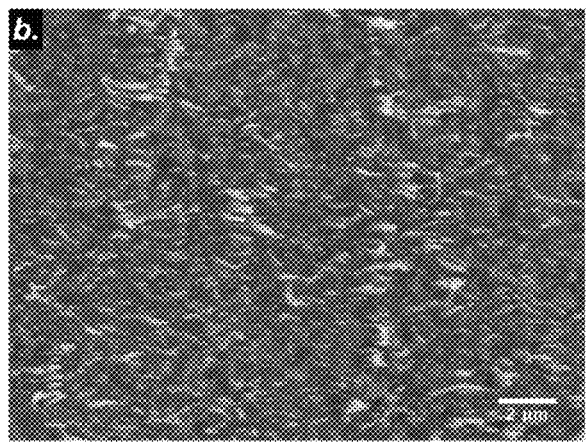
Figure 7C:
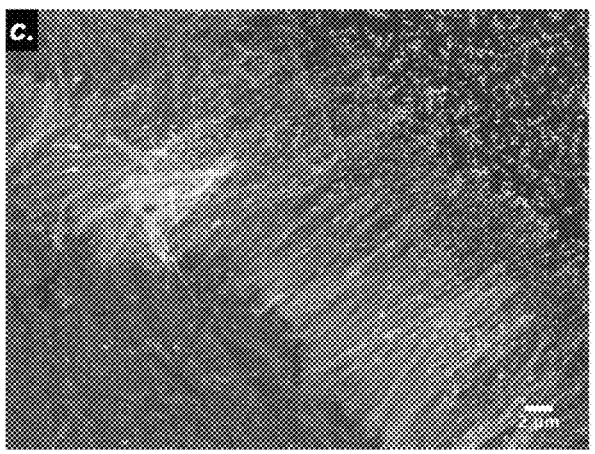
Figure 7D:
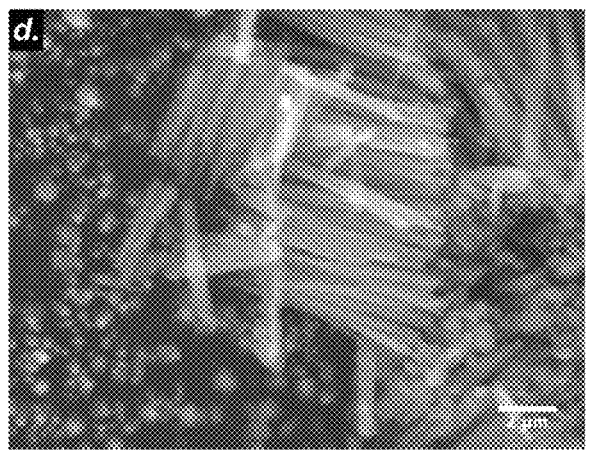

Experiments were carried out by keeping all parameters constant with the exception of plasma power. At a lower plasma power (9 W), sparse growth of spaghetti-like VACNTs was observed, as shown in FIG. 7a. As the plasma power was increased, alignment, length and density of the VACNTs were improved. In preferred embodiments, plasma power is approximately 70 W during growth and alignment of the VACNTs when using the PECVD system as seen in FIG. 1. Short and thick VACNTs having average length of approximately 5 μm and diameter of approximately 500 nm can be produced at a higher plasma power, for example, 92 W, as seen in FIG. 7d.

Figure 5A:
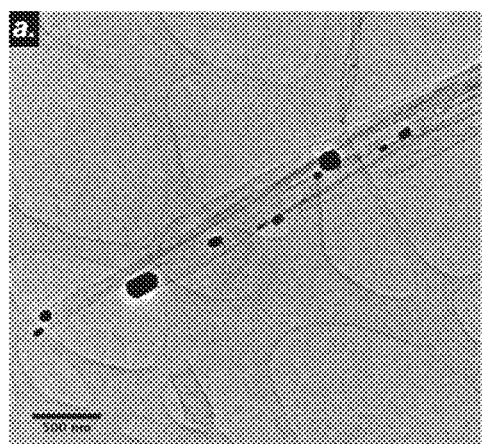
FIG. 5a shows a low-resolution TEM image of as-synthesized VACNTs at 760° C. at standard conditions with catalyst particles at the tip.
Figure 5B:
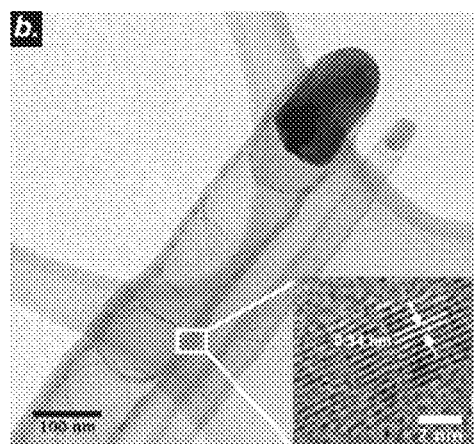
FIG. 5b shows a low-resolution TEM image of as-synthesized VACNTs at 760° C. at standard conditions and having a "bamboo-like structure.

Low and high resolution TEM images were used to further investigate the nano-structure of the as-synthesized VACNTs. FIGS. 5a and 5b show low resolution TEM images of the VACNTs (corresponding SEM image shown in FIG. 4d), which confirm the tubular structure of multi-walled VACNTs having different diameters. The VACNTs have catalyst particles of different sizes anchored at the tip, which can also be seen in the SEM images shown in FIG. 4, indicating the tip growth model.

VACNTs with a smaller diameter contain smaller particles and VACNTs with a large diameter contain larger particles at the tip. Under appropriate synthesis conditions, VACNTs with a diameter in the range of 5 to 500 nm can be synthesized. The size of the catalyst nano-hill fragments detached from the surface of the substrate during the growth process can control the diameter of the VACNT. The VACNTs in FIG. 5b displays the bamboo-like structure with a slightly larger diameter at the base than at the top. This non-uniformity in diameter along the VACNT length can be due to the change in shape and size of the catalyst particle caused by the dissolution and precipitation of carbon during the growth process. The observed bamboo-like structure can be due to the formation of conical (bell-shaped) structures that are doped with nitrogen resulting in excess pentagons at the upper end of the conical structures and their linear polymerization.

Figure 5C:
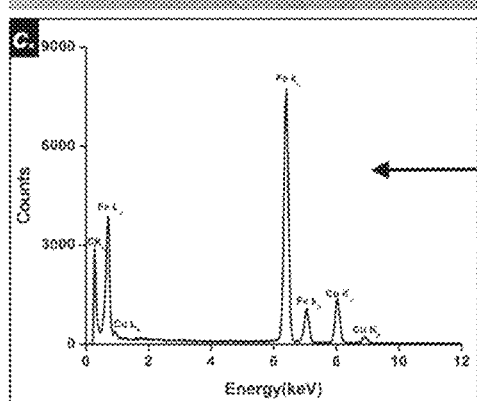
" FIG. 5c is a plot of the EDS spectrum showing the composition of the particle at the tip of a VACNT.

The inset in FIG. 5b shows a high resolution TEM image of the well-graphitized multilayer of a VACNT wall. The separation between the adjacent layers is approximately 0.34 nm, which corresponds to the lattice fringe distance of (002) graphitic plane showing clear multi-walled VACNTs. FIG. 5c shows the EDS spectrum obtained from the catalyst particle present at the tip of the VACNT. This plot shows peaks correlating to Fe, Cu, and C. Here, the Cu and C peaks are associated with TEM sample grid and the VACNTs, respectively. This result suggests that the catalyst particle at the tip of the VACNT is Fe. However, EDS taken from other tip particles show the presence of other elements such as Ni, Mn, Cr, etc. The absence of oxygen in this spectrum rules out the possibility of formation of Fe-oxides, although presence of C can indicate the presence of Fe carbide.

Figure 5D:
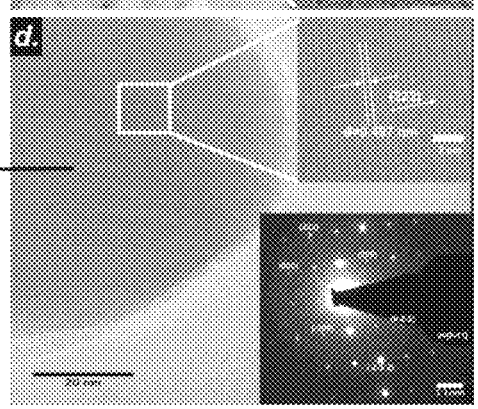
FIG. 5d is a high resolution TEM (HRTEM) image of the particle at the tip of a VACNT enclosed by few layers of graphitic layers.

FIG. 5d shows a high resolution TEM image of a catalyst particle present at the tip of a VACNT. The top inset is a high magnification image of the selected area, as shown in the white box and shows the lattice plane distance of 0.497 nm, which corresponds to the (222) lattice plane of body centered cubic (bcc) crystal of Fe. Also, the bottom inset in FIG. 5d displays the selected area diffraction (SAED) pattern of the particle at the tip of the VACNT. The bright spots on the SAED image can be indexed as (200), (220) and (222) planes of bcc Fe crystal along the [0-11] zone axis. These results along with the EDS spectrum shown in FIG. 5c confirm the presence of single crystalline Fe particle at the tip of the VACNT. Fe acted as the catalyst during the VACNT synthesis process, even though other transition metals such as Ni, Cr, Mn were also present at the catalyst nano-hills and revealed by the EDS spectrum shown in FIG. 3d.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:
1. A plasma enhanced chemical vapor deposition (PECVD) apparatus, comprising:
 a tube;
 two metallic rods disposed inside the tube and each having a respective electrode disposed on an inner end thereof;
 a substrate holder disposed on the inner end of one of the two metallic rods;
 an external heating device surrounding the substrate holder;

a thermocouple device disposed inside the tube and configured to monitor a temperature and provide feedback to a power supply of the heating device;
a heat reflector disposed inside the tube;
a gas inlet valve and a gas outlet valve connected to the tube; and
a voltage supply electrically connected to the two metallic rods and configured to supply a desired bias voltage to generate plasma inside the tube.

2. The apparatus according to claim 1, the external heating device surrounding the respective electrode disposed on the inner end of each metallic rod of the two metallic rods.

3. The apparatus according to claim 1, further comprising a pump connected to the gas outlet valve.

4. The apparatus according to claim 1, further comprising a pressure gauge configured to detect a pressure inside the tube.

5. The apparatus according to claim 1, the external heating device being an infrared image furnace.

6. The apparatus according to claim 1, the tube being a quartz tube.

7. The apparatus according to claim 1, further comprising a plurality of gas regulators configured to regulate a flow of gas into and out of the tube.

8. The apparatus according to claim 1, the two electrodes being at a distance of 1.4 cm from each other.

9. The apparatus according to claim 1, the substrate holder being one electrode of the two electrodes.

10. The apparatus according to claim 1, further comprising a gas distributor inside the tube.

11. A plasma enhanced chemical vapor deposition (PECVD) apparatus, comprising:
a tube;
a first metallic rod disposed inside the tube and having an anode disposed on an inner end thereof;
a second metallic rod disposed inside the tube and having a cathode disposed on an inner end thereof;
a substrate holder disposed on the cathode;
an external heating device surrounding the substrate holder;
a thermocouple device disposed inside the tube and configured to monitor a temperature and provide feedback to the power supply of the heating device;
a gas inlet valve connected to a first end of the tube;
a heat reflector disposed inside the tube;
a gas outlet valve connected to the tube; and
a power supply electrically connected to the first metallic rod and the second metallic rod and configured to supply a desired bias voltage to generate plasma inside the tube.

12. The apparatus according to claim 11, the external heating device surrounding the anode and the cathode.

13. The apparatus according to claim 11, further comprising a gas distributor disposed inside the tube.

14. The apparatus according to claim 11, further comprising a pump connected to the gas outlet valve and a pressure gauge configured to detect a pressure inside the tube.

15. The apparatus according to claim 11, the external heating device being an infrared image furnace.

16. The apparatus according to claim 11, the tube being a quartz tube.

17. The apparatus according to claim 11, further comprising a plurality of gas regulators configured to regulate a flow of gas into and out of the tube.

18. The apparatus according to claim 11, the anode and the cathode being at a distance of 1.4 cm from each other.

19. The apparatus according to claim 11, further comprising a gas distributor disposed inside the tube,
the anode having a first surface facing the gas inlet valve and a second surface opposite from the first surface,
the cathode having a first surface and a second surface opposite from the first surface, the first surface of the cathode facing a second end of the tube opposite from the first end of the tube, and the second surface of the cathode facing the second surface of the anode and having the substrate holder disposed thereon,
the thermocouple device being disposed between the first surface of the anode and the first end of the tube, and
the heat reflector and the gas distributor both disposed between the thermocouple device and the first end of the tube, the heat reflector and the gas distributor both being disposed closer to the first end of the tube than they are to the thermocouple device.

20. A plasma enhanced chemical vapor deposition (PECVD) apparatus, comprising:
a tube;
a first metallic rod disposed inside the tube and having an anode disposed on an inner end thereof;
a second metallic rod disposed inside the tube and having a cathode disposed on an inner end thereof;
a substrate holder disposed on the cathode;
an external heating device surrounding the substrate holder, the anode, and the cathode;
a thermocouple device disposed inside the tube and configured to monitor a temperature and provide feedback to the power supply of the heating device;
a gas inlet valve connected to a first end of the tube;
a gas outlet valve connected to the tube;
a heat reflector disposed inside the tube;
a gas distributor disposed inside the tube;
a power supply electrically connected to the first metallic rod and the second metallic rod and configured to supply a desired bias voltage to generate plasma inside the tube;
a pump connected to the gas outlet valve;
a pressure gauge configured to detect a pressure inside the tube; and
a plurality of gas regulators configured to regulate a flow of gas into and out of the tube,
the external heating device being an infrared image furnace;
the tube being a quartz tube,
the anode having a first surface facing the gas inlet valve and a second surface opposite from the first surface,
the cathode having a first surface and a second surface opposite from the first surface, the first surface of the cathode facing a second end of the tube opposite from the first end of the tube, and the second surface of the cathode facing the second surface of the anode and having the substrate holder disposed thereon,
the thermocouple device being disposed between the first surface of the anode and the first end of the tube, and
the heat reflector and the gas distributor both disposed between the thermocouple device and the first end of the tube, the heat reflector and the gas distributor both being disposed closer to the first end of the tube than they are to the thermocouple device.

* * * * *

UNITED STATES PATENT AND TRADEMARK OFFICE
CERTIFICATE OF CORRECTION

| | | |
|---|---|---|
| PATENT NO. | : 10,961,123 B2 | Page 1 of 1 |
| APPLICATION NO. | : 16/435989 | |
| DATED | : March 30, 2021 | |
| INVENTOR(S) | : Wenzhi Li | |

It is certified that error appears in the above-identified patent and that said Letters Patent is hereby corrected as shown below:

In the Specification

Column 1, Lines 13-18:
"This invention was made with government support under Grant Nos. DMR0548061 and DMR1506640 awarded by the National Science Foundation. The government has certain rights in the invention."

Should read:
--This invention was made with government support under DMR0548061 and DMR1506640 awarded by the National Science Foundation. The government has certain rights in the invention.--

Signed and Sealed this
Sixth Day of June, 2023

Katherine Kelly Vidal
*Director of the United States Patent and Trademark Office*